(12) United States Patent
Wu

(10) Patent No.: US 12,743,018 B2
(45) Date of Patent: Sep. 22, 2026

(54) RETICLE-LIKE SENSING ASSEMBLY

(71) Applicant: MICROPROGRAM INFORMATION CO., LTD., Taichung (TW)

(72) Inventor: Teng Yen Wu, Taichung (TW)

(73) Assignee: MICROPROGRAM INFORMATION CO., LTD., Taichung (TW)

( * ) Notice: Subject to any disclaimer, the term of this patent is extended or adjusted under 35 U.S.C. 154(b) by 368 days.

(21) Appl. No.: 18/413,773

(22) Filed: Jan. 16, 2024

(65) Prior Publication Data

US 2024/0302733 A1 Sep. 12, 2024

(30) Foreign Application Priority Data

Mar. 10, 2023 (TW) ................................ 112108958

(51) Int. Cl.

| | |
|---|---|
| ***G03F 1/44*** | (2012.01) |
| ***G01M 99/00*** | (2011.01) |
| ***G03F 1/66*** | (2012.01) |
| ***G03F 7/00*** | (2006.01) |
| ***H10P 72/00*** | (2026.01) |
| ***H10P 72/10*** | (2026.01) |

(52) U.S. Cl.

CPC ............. *G03F 1/44* (2013.01); *G01M 99/005* (2013.01); *G03F 1/66* (2013.01); *G03F 7/70491* (2013.01); *G03F 7/7085* (2013.01); *H10P 72/0602* (2026.01); *H10P 72/0604* (2026.01); *H10P 72/1902* (2026.01); *H10P 72/1906* (2026.01)

(58) Field of Classification Search

CPC ...... G03F 1/44; G03F 7/70491; G03F 7/7085; G03F 1/66; G01M 99/005; H10P 72/0602; H10P 72/0604; H10P 72/1902; H10P 72/1906

USPC ........................................................... 73/649

See application file for complete search history.

(56) References Cited

U.S. PATENT DOCUMENTS

2014/0190265 A1* 7/2014 Acharya ................ G01H 11/00 73/649
2019/0362989 A1* 11/2019 Reuter ................ H10P 72/0402
2021/0313205 A1* 10/2021 Sugiura ............... H10P 72/0434
2022/0206031 A1* 6/2022 Choi ....................... G01P 1/023

FOREIGN PATENT DOCUMENTS

TW I463251 B 12/2014

* cited by examiner

*Primary Examiner* — Peter J Macchiarolo
*Assistant Examiner* — John M Royston
(74) *Attorney, Agent, or Firm* — Sinorica International Patent & Trademark

(57) ABSTRACT

A reticle-like sensing assembly comprises a main body, a sensing module, a power supply and a wireless charging receiver. The main body has a space therein; wherein the main body has a dimension identical to the real reticle to collecting various data which affects a reticle in a lithography process. The sensing module is received in the space of the main body to sense information related to the main body and compute the information to obtain a sensing data accordingly. The power supply is received in the space of the main body and electrically connected to the sensing module to provide electric power to the sensing module. The wireless charging receiver is received in the space of the main body and electrically connected to the power supply to be driven to charge the power supply.

18 Claims, 4 Drawing Sheets

RETICLE-LIKE SENSING ASSEMBLY

BACKGROUND OF THE DISCLOSURE

1. Field of the Disclosure

The present invention relates generally to manufacturing process of semiconductor, and more particularly to a reticle-like sensing assembly capable of collecting various data which affects a reticle in a simulating lithography process.

2. Description of the Prior Art

Lithography process is one of the important procedures of semiconductor manufacturing process. In lithography process, a reticle is placed on a wafer coated with photoresist, and then the photoresist is exposed under a light with a predetermined wavelength through the reticle to produce a predetermined pattern on the reticle for the following etching process. A conventional reticle has a quartz substrate coated with a patterned metallic film, such as chromium. The same as the wafer, the reticle is weak and breakable so that the reticle is easy to get damage because of the vibration or tilt in the lithography process. Besides, the environment facts, such as temperature and humidity, may damage the reticle as well. Therefore, the lithography process would fail just because a damaged reticle is involved.

Taiwan patent no. 1463251 discloses a reticle structure capable of sensing the environment information. Several environmental information sensing areas and a transmission module are provided on a reticle to collect the environment data in lithography process. However, the prior art is collecting data as the lithography process is proceeding, and there is no way but stop the lithography process when a bad data is found, and the reticle may already be damaged. In other words, the prior art collects the real time data to find the happening error, but it can't prevent the damage. In conclusion, to collect the data of the reticle and environment information in advance to prevent the damage in the important issue of the semiconductor manufacturing.

SUMMARY OF THE DISCLOSURE

In light of the above reasons, the primary objective of the present invention is to provide a reticle-like sensing assembly capable of collecting various data which affects a reticle in a simulating lithography process, thereby discovering in advance whether there is any abnormal issue in an actual lithography process.

In order to fix the problem as described above the present invention provides a sensing assembly, comprising: a main body having a space therein; a sensing module received in the space of the main body to sense information related to the main body and compute the information to obtain a sensing data; a power supply received in the space of the main body and electrically connected to the sensing module to provide electric power to the sensing module; a wireless charging receiver received in the space of the main body and electrically connected to the power supply to be driven to charge the power supply; and a charging case having a charging space therein; wherein the main body is received in the charging space and the charging case has a wireless charger corresponded to the wireless charging receiver to drive the wireless charging receiver to charge the power supply.

In an embodiment, the main body has a base and a cover; the base has a groove therein; the cover is engaged with a top of the groove, and the space is generated between the groove and the cover.

In an embodiment, a length, a width and a height of the main body are identical to that of a real reticle.

In an embodiment, the main body has a filler with a predetermined weight to fill up the space.

In an embodiment, the sensing module has a circuit board, a sensing unit and a computing unit; the sensing unit and the computing unit are mounted on the circuit board; the sensing unit is configured to collect the information and generate a sensing signal accordingly; the computing unit is configured to receive the sensing signal of the sensing unit and compute the sensing data accordingly.

In an embodiment, the sensing module further comprises a storage unit and a transmission unit; the storage unit is mounted on the circuit board and electrically connected to the computing unit to save the sensing data from the computing unit; the transmission unit is mounted on the circuit board and electrically connected to the storage unit to transmit the sensing data saved in the storage unit to an external remote device.

In an embodiment, the sensing unit comprises a vibration sensor to collect a vibration level of the main body and generate a vibration signal accordingly; the computing unit computes a vibration value according to the vibration signal from the vibration sensor.

In an embodiment, the sensing unit comprises a balance sensor to collect a tilt level of the main body and generate a balance signal accordingly; the computing unit computes an angle changing value according to the balance signal from the balance sensor.

In an embodiment, wherein the sensing unit comprises a temperature sensor to collect a temperature of an environment surrounding the main body and generate a temperature signal accordingly; the computing unit computes a temperature value according to the temperature signal from the temperature sensor.

In an embodiment, the sensing unit comprises a humidity sensor to collect a humidity of an environment surrounding the main body and generate a humidity signal accordingly; the computing unit computes a humidity value according to the humidity signal from the humidity sensor.

In an embodiment, A sensing assembly, comprising: a main body having a space therein; a sensing module received in the space of the main body to sense information related to the main body and compute the information to obtain a sensing data; a power supply received in the space of the main body and electrically connected to the sensing module to provide electric power to the sensing module; and a wireless charging receiver received in the space of the main body and electrically connected to the power supply to be driven to charge the power supply.

BRIEF DESCRIPTION OF THE DRAWINGS

The present invention will be best understood by referring to the following detailed description of one illustrative embodiment in conjunction with the accompanying drawings, in which.

DETAILED DESCRIPTION

Figure 1:
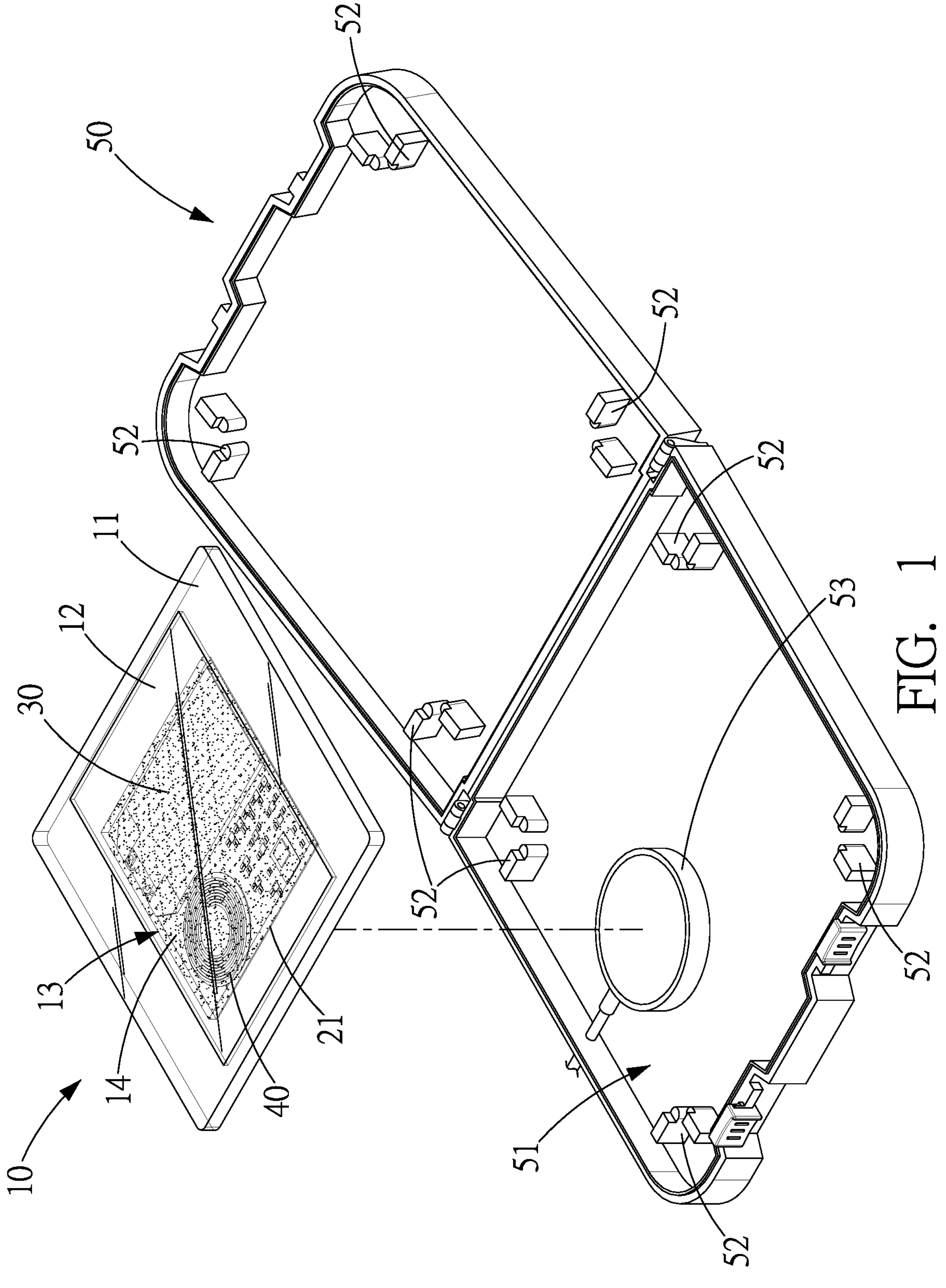
FIG. 1 is an exploded view of a preferred embodiment of the present invention.
Figure 2:
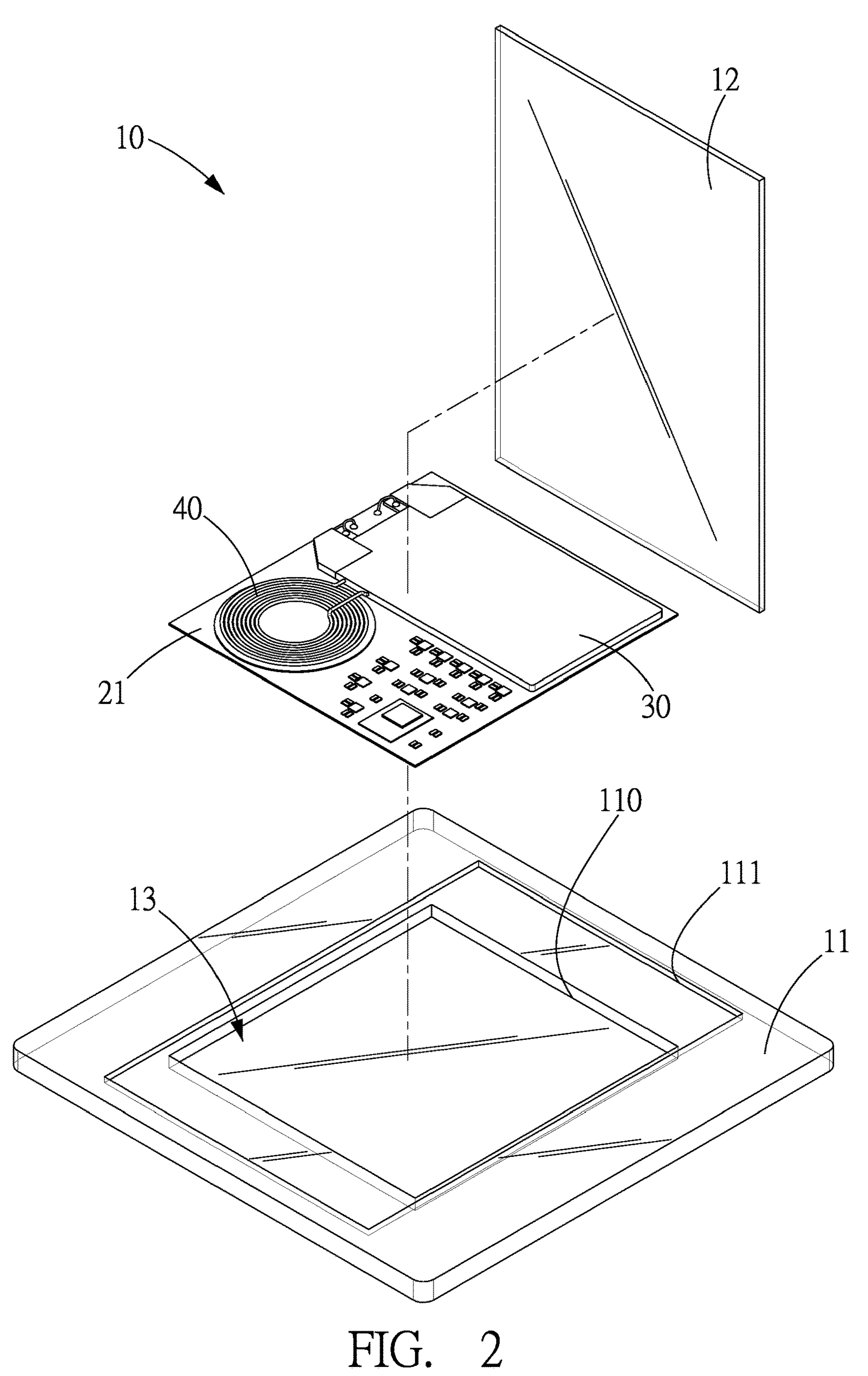
FIG. 2 is an exploded view of the main body of the preferred embodiment of the present invention.
Figure 3:
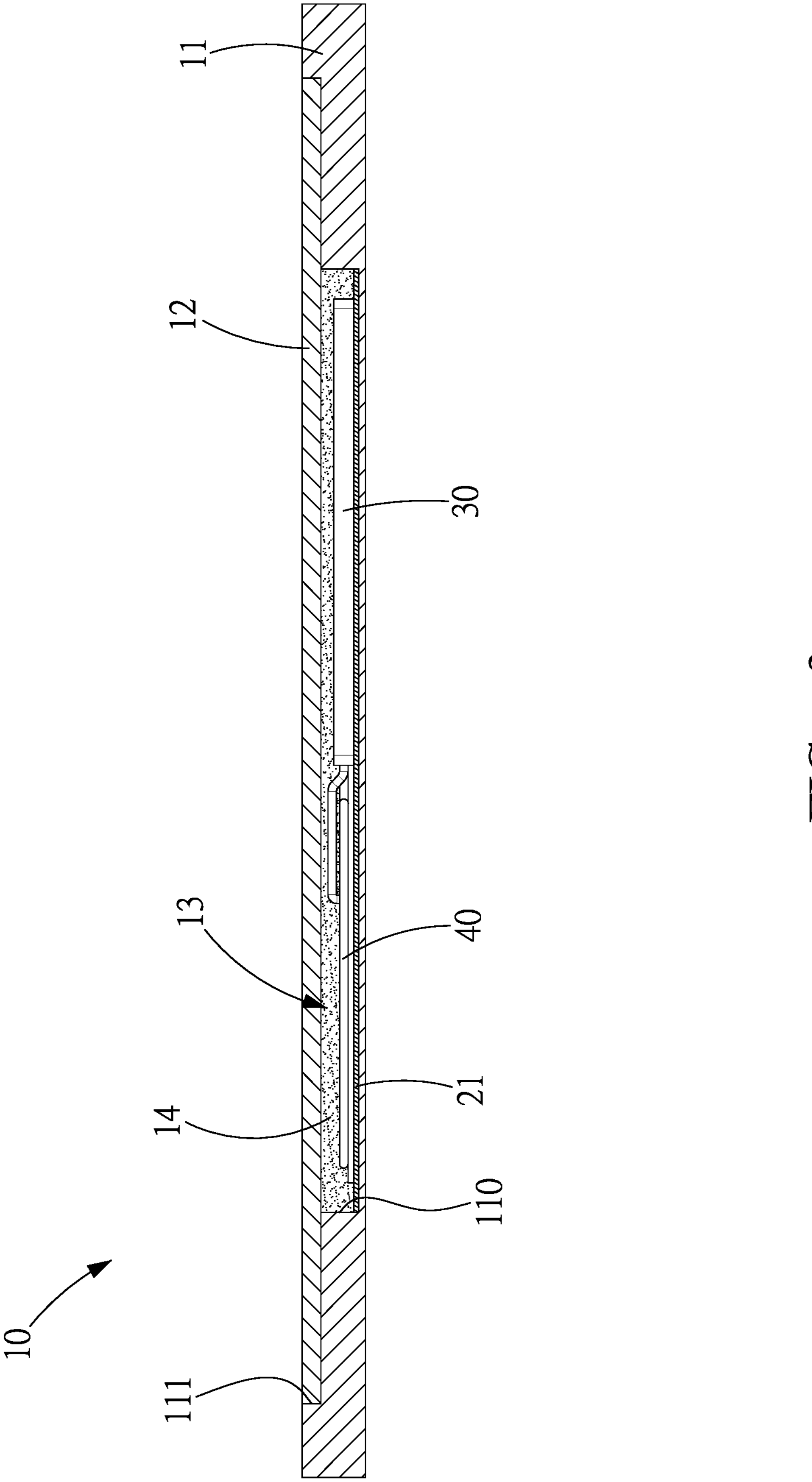
FIG. 3 is a sectional view of the preferred embodiment of the present invention.
Figure 4:
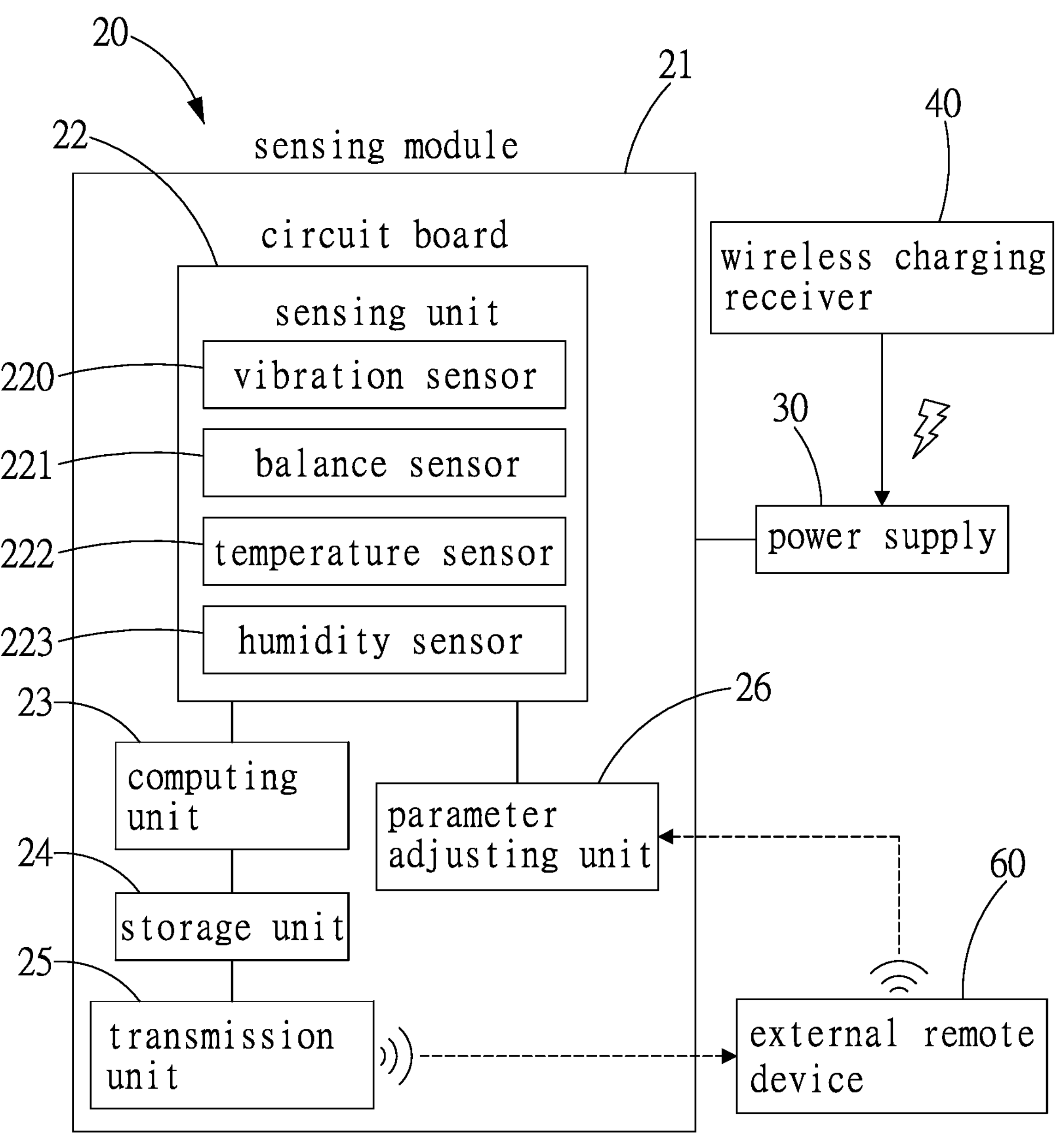
FIG. 4 is a block diagram of the preferred embodiment of the present invention.

As shown in FIGS. 1-4, a sensing assembly of a preferred embodiment of the present invention includes a main body 10, a sensing module 20, a power supply 30, a wireless charging receiver 40 and a charging case 50.

A dimension of the main body 10 is identical to that of a real reticle. For example, in the preferred embodiment, the real reticle is a flat rectangular structure with a length, a width and a height of 6 inches, 6 inches and 0.25 inches respectively; while the main body 10 is also a flat rectangular structure with a length, a width and a height of 6 inches, 6 inches and 0.25 inches respectively. In an alternate preferred embodiment, the dimension of the main body can be changed for fitting reticles with different sizes. The main body 10 has a base 11 and a cover 12, the base 11 and the cover 12 are each a sheet-like member, and the cover 12 is engaged with a top surface of the base 11. In the preferred embodiment, the base 11 and the cover 12 are made of quartz glass. In an alternate preferred embodiment, the base and the cover are made of hardened glass, heat-resistant glass, soda-lime glass or any other equivalent material that can be used for general reticles. The main body 10 has a space 13 therein. The sensing module 20, the power supply 30 and the wireless charging receiver 40 are received in the space 13. The base 11 has a groove 110 therein. The cover 12 is mounted on a top of the groove 110, so that the space 13 is generated between the groove 110 and the cover 12. In the preferred embodiment, the base 11 further includes a second groove 111 surrounded the groove 110 and connected to the top of the groove 110, wherein a height of the second groove 111 is higher than that of the groove 110. The second groove 111 is corresponded to the cover 12 so that the cover 12 is received in the second groove 111, and a height of the cover 12 is the same as that of the base 11. In an alternate preferred embodiment, the cover covers the top of the base, so that the height of the cover is higher than that of the base. Furthermore, the main body 10 includes a filler 14 with a predetermined weight in the space 13, filling up the space 13 to limit the sensing module 20, the power supply 30 and the wireless charging receiver 40 from moving. A staff may adjust a weight and a center of gravity of the main body 10 by adjusting a material and a weight of the filler 14, so that the weight and the center of gravity of the main body 10 are identical to a weight and a center of gravity of the real reticle, in order to make the simulation results more closer to an actual lithography environment. In the preferred embodiment, the filler 14 is epoxy resin. In an alternate preferred embodiment, the filler can be gel, air, or vacuum.

The sensing module 20 includes a circuit board 21, a sensing unit 22, a computing unit 23, a storage unit 24, a transmission unit 25 and a parameter adjusting unit 26. The circuit board 21 is received in the space 13 of the main body 10 and engaged with a bottom of the groove 110 of the base 11. A height of the circuit board 21 is lower than that of the groove 110. The sensing unit 22, the computing unit 23, the storage unit 24, the transmission unit 25 and the parameter adjusting unit 26 is electrically connected to the circuit board 21.

The sensing unit 22 is configured to collect information related to the main body 10 and generate a sensing signal accordingly at each predetermined interval time. In the preferred embodiment, the sensing unit 22 includes a vibration sensor 220, a balance sensor 221, a temperature sensor 222 and a humidity sensor 223. The information includes a vibration level of the main body 10, a tilt level of the main body 10, a temperature of an environment and a humidity of the environment. The vibration sensor 220 is configured to sense a vibration level of the main body 10 and generate a vibration signal accordingly, then transmit the vibration signal to the computing unit 23. The balance sensor 221 is configured to sense a tilt level of the main body 10 and generate a balance signal accordingly, then transmit the balance signal to the computing unit 23. The temperature sensor 222 is configured to sense a temperature of the environment and generate a temperature signal accordingly, then transmit the temperature signal to the computing unit 23. The humidity sensor 223 is configured to sense a humidity of the environment and generate a humidity signal accordingly, then transmit the humidity signal to the computing unit 23. The sensing signal therefore includes the vibration signal, the balance signal, the temperature signal and the humidity signal.

The computing unit 23 is electrically connected to the sensing unit 22 to obtain various sensing data according to the sensing signal from the sensing unit 22. In the preferred embodiment, the sensing data includes a vibration value, an inclination angle value (or an angle changing value), a temperature value and a humidity value. The computing unit 23 is able to obtain the vibration value according to the vibration signal from the vibration sensor 220, the inclination angle value (or the angle changing value) according to the balance signal of the balance sensor 221, the temperature value according to the temperature signal of the temperature sensor 222, and the humidity value according to the humidity signal of the humidity sensor 223.

The storage unit 24 is electrically connected to the computing unit 23 to receive and save the sensing data from the computing unit 23. In the preferred embodiment, the storage unit 24 is able to continuously record the sensing data for more than 4 hours.

The transmission unit 25 is electrically connected to the storage unit 24 to transmit the sensing data saved in the storage unit 24 to an external remote device 60 through wired transmission or wireless transmission (including WIFI, Bluetooth, far infrared, and/or radio frequency circuits). In the preferred embodiment, the external remote device 60 can be a personal mobile device (ex. smart phone, pad), a computer, a physical server or a cloud server. In an alternate preferred embodiment, the transmission unit is electrically connected to the sensing unit and/or the computing unit to transmit the sensing signal from the sensing unit and/or the sensing data from the computing unit to the external remote device.

The parameter adjusting unit 26, which is electrically connected to the sensing unit 22 and communicated to the external remote device 60, is configured to adjust correlated parameters of the sensing unit 22 by operating the external remote device 60. The correlated parameters includes a vibration parameter of the vibration sensor 220, a balance parameter of the balance sensor 221, a temperature parameter of the temperature sensor 222 and a humidity parameter of the humidity sensor 223.

It should be noted that the sensing module 20 of the present invention only includes the vibration sensor 220, the balance sensor 221, the temperature sensor 222 and the humidity sensor 223. But in an alternate preferred embodiment, the staff can freely add a pressure sensor, an illumination sensor or any kind of sensor to the sensing unit if needed.

The power supply 30 is received in the space 13 of the main body 10 and mounted on the circuit board 21, and a height of the power supply 30 is lower than that of the groove 110. The power supply 30 is electrically connected to the sensing module 20 to provide electrical power to the sensing module 20. The power supply 30 is a rechargeable battery, for example, a lithium battery, a button battery or any other thin battery that can be received in the groove 110 of the base 11. In the preferred embodiment, the power supply 30 can continuously support the sensing module 20 to work for more than 4 hours when the power supply 30 is fully charged.

The wireless charging receiver 40 is received in the space 13 of the main body 10 and mounted on the circuit board 21, and a height of the wireless charging receiver 40 is lower than that of the groove 110. The wireless charging receiver 40 is a receiving coil electrically connected to the power supply 30. The receiving coil can be driven by external electromagnetic induction to generate electric power to charge the power supply 30.

The charging case 50 is an openable case. The charging case 50 has a charging space 51 therein to receive the main body 10, and a plurality of limiting member 52 engaged the main body 10 to restrict the movement of the main body 10. The charging case 50 further includes a wireless charger 53 arranged in a bottom of the charging case 50. The wireless charger 53 is corresponded to the wireless charging receiver 40 with an end electrically connected to a switch (not shown). When the main body 10 is placed in the charging space 51 of the charging box 50, a magnetic field change can be generated by the wireless charger 53, causing the wireless charging receiver 40 to generate electric power by electromagnetic induction. Thereby, the power supply 30 is able to provide enough electric power to the sensing module 20 when the main body 10 is received in the charging case 50, which relatively improves the endurance of the power supply 30.

When there is any abnormal issue need to be figured out before/after an actual lithography process, the staff is able to use the main body 10 to run a simulating lithography process. The simulating lithography process shares the same processes with the actual lithography process. For example, the actual lithography process comprises a reticle transporting process and a reticle working process. The reticle transporting process includes a transportation of the real reticle before entering a work machine and after leaving the work machine. The reticle working process includes the process of the real reticle being moved and used in the work machine. The only difference between the simulating lithography process and the actual lithography process is that the actual lithography process is a process using the real reticle to work, while the simulating lithography process is a process not using the real reticle but using the main body 10 to simulate.

During the simulating lithography process, the main body 10 will be transported by a transportation device (such as a robotic arm, a lifting track, a transport vehicle, a manual handling, etc.) before enter the working machine or after leaving the working machine, or be transported by a transfer device (such as a robotic arm, an automatic robot, a lifting device, etc.) in the working machine. The sensing unit 22 of the sensing module 20 will sense the information related to the main body 10 and the surrounding environment in real time once every interval. For example, in the preferred embodiment, the vibration sensor 220 will detect the vibration of the main body 10 during the simulating lithography process; the balance sensor 221 will detect the degree of inclination of the main body 10 during the simulating lithography process; the temperature sensor 222 will detect the temperature of the surrounding environment during the simulating lithography process; the humidity sensor 223 will detect the humidity of the surrounding environment during the simulating lithography process. After that the sensing unit 22 generates the sensing signal accordingly and transmit the sensing signal to the computing unit 23 to convert into the sensing data, the sensing data will then be saved to the storage unit 24 and/or transmitted to the external remote device 60 by the transmission unit 25 during or after the simulating lithography process.

Due to the identical dimension and weight between the main body 10 and the reticle, plus the simulating lithography process shares the same transporting path with the actual lithography process, the information collected by the sensing module 20 of the simulating lithography process can be regard as information of the real reticle of the actual lithography process. Thereby, the staff may analyze the sensing data to predict the performance of the real reticle. For example, the sensing data can predict whether the real reticle will encounter vibration or tilt during the actual lithography process, or whether the temperature and humidity of the environment will cause the real reticle to deform, expand, shrink or become brittle. If the analysis result shows the information is abnormal, the staff may conduct inspection and maintenance of the working environment and the working machine afterward to prevent the reticle from affected by the information in later actual lithography process.

In conclusion, the present invention provides the reticle-like sensing assembly with the main body 10 identical to the real reticle to collect various data in the simulate lithography process, and the data can be measured to predict the real reticle's performance, thus the present invention can effectively find out the problem of the real reticle being affected by environmental factors before next lithography process. On the other hand, the present invention also provides wireless charging technology that can solve the problem of the endurance of the power supply 30, which relatively improves the endurance of the sensing module 20.

It should be realized that the above description is only some preferred embodiments of the present invention and should not be deemed as limitations of implementing the present invention. All substantially equivalent variations and modifications which employ the concepts disclosed in this specification and the appended claims should fall within the scope of the present invention.

What is claimed is:

1. A sensing assembly, comprising:

a main body having a space therein;

a sensing module received in the space of the main body to sense information related to the main body and compute the information to obtain a sensing data;

a power supply received in the space of the main body and electrically connected to the sensing module to provide electric power to the sensing module;

a wireless charging receiver received in the space of the main body and electrically connected to the power supply to be driven to charge the power supply; and a charging case having a charging space therein; wherein the main body is received in the charging space and the charging case has a wireless charger corresponded to the wireless charging receiver to drive the wireless charging receiver to charge the power supply;

wherein the main body has a base and a cover; the base has a groove therein; the cover is engaged with a top of the groove, and the space is generated between the groove and the cover.

2. The sensing assembly of claim 1, wherein a length, a width and a height of the main body are identical to that of a real reticle.

3. The sensing assembly of claim 1, wherein the main body has a filler with a predetermined weight to fill up the space.

4. The sensing assembly of claim 1, wherein the sensing module has a circuit board, a sensing unit and a computing unit; the sensing unit and the computing unit are mounted on the circuit board; the sensing unit is configured to collect the information and generate a sensing signal accordingly; the computing unit is configured to receive the sensing signal of the sensing unit and compute the sensing data accordingly.

5. The sensing assembly of claim 4, wherein the sensing module further comprises a storage unit and a transmission unit; the storage unit is mounted on the circuit board and electrically connected to the computing unit to save the sensing data from the computing unit; the transmission unit is mounted on the circuit board and electrically connected to the storage unit to transmit the sensing data saved in the storage unit to an external remote device.

6. The sensing assembly of claim 4, wherein the sensing unit comprises a vibration sensor to collect a vibration level of the main body and generate a vibration signal accordingly; the computing unit computes a vibration value according to the vibration signal from the vibration sensor.

7. The sensing assembly of claim 4, wherein the sensing unit comprises a temperature sensor to collect a temperature of an environment surrounding the main body and generate a temperature signal accordingly; the computing unit computes a temperature value according to the temperature signal from the temperature sensor.

8. The sensing assembly of claim 4, wherein the sensing unit comprises a humidity sensor to collect a humidity of an environment surrounding the main body and generate a humidity signal accordingly; the computing unit computes a humidity value according to the humidity signal from the humidity sensor.

9. A sensing assembly, comprising:

a main body having a space therein;

a sensing module received in the space of the main body to sense at least an information related to the main body and compute the information to obtain a sensing data;

a power supply received in the space of the main body and electrically connected to the sensing module to provide electric power to the sensing module; and a wireless charging receiver received in the space of the main body and electrically connected to the power supply to be driven to charge the power supply;

wherein the main body has a base and a cover; the base has a groove therein; the cover is engaged with a top of the groove, and the space is generated between the groove and the cover.

10. The sensing assembly of claim 9, wherein a length, a width and a height of the main body are identical to that of a real reticle.

11. The sensing assembly of claim 9, wherein the main body has a filler with a predetermined weight to fill up the space.

12. The sensing assembly of claim 9, wherein the sensing module has a circuit board, a sensing unit and a computing unit; the sensing unit and the computing unit are mounted on the circuit board; the sensing unit is configured to collect the information and generate a sensing signal accordingly; the computing unit is configured to receive the sensing signal of the sensing unit and compute the sensing data accordingly.

13. The sensing assembly of claim 12, wherein the sensing module further comprises a storage unit and a transmission unit; the storage unit is mounted on the circuit board and electrically connected to the computing unit to save the sensing data from the computing unit; the transmission unit is mounted on the circuit board and electrically connected to the storage unit to transmit the sensing data saved in the storage unit to an external remote device.

14. The sensing assembly of claim 12, wherein the sensing unit comprises a vibration sensor to collect a vibration level of the main body and generate a vibration signal accordingly; the computing unit computes a vibration value according to the vibration signal from the vibration sensor.

15. The sensing assembly of claim 12, wherein the sensing unit comprises a temperature sensor to collect a temperature of an environment surrounding the main body and generate a temperature signal accordingly; the computing unit computes a temperature value according to the temperature signal from the temperature sensor.

16. The sensing assembly of claim 12, wherein the sensing unit comprises a humidity sensor to collect a humidity of an environment surrounding the main body and generate a humidity signal accordingly; the computing unit computes a humidity value according to the humidity signal from the humidity sensor.

17. A sensing assembly, comprising:

a main body having a space therein;

a sensing module received in the space of the main body to sense information related to the main body and compute the information to obtain a sensing data;

a power supply received in the space of the main body and electrically connected to the sensing module to provide electric power to the sensing module;

a wireless charging receiver received in the space of the main body and electrically connected to the power supply to be driven to charge the power supply; and a charging case having a charging space therein; wherein the main body is received in the charging space and the charging case has a wireless charger corresponded to the wireless charging receiver to drive the wireless charging receiver to charge the power supply;

wherein the sensing module has a circuit board, a sensing unit and a computing unit; the sensing unit and the computing unit are mounted on the circuit board; the sensing unit is configured to collect the information and generate a sensing signal accordingly; the computing unit is configured to receive the sensing signal of the sensing unit and compute the sensing data accordingly;

wherein the sensing unit comprises a balance sensor to collect a tilt level of the main body and generate a balance signal accordingly; the computing unit computes an angle changing value according to the balance signal from the balance sensor.

18. A sensing assembly, comprising:

a main body having a space therein;

a sensing module received in the space of the main body to sense at least an information related to the main body and compute the information to obtain a sensing data;

a power supply received in the space of the main body and electrically connected to the sensing module to provide electric power to the sensing module; and a wireless charging receiver received in the space of the main body and electrically connected to the power supply to be driven to charge the power supply;

wherein the sensing module has a circuit board, a sensing unit and a computing unit; the sensing unit and the computing unit are mounted on the circuit board; the sensing unit is configured to collect the information and generate a sensing signal accordingly; the computing unit is configured to receive the sensing signal of the sensing unit and compute the sensing data accordingly;

wherein the sensing unit comprises a balance sensor to collect a tilt level of the main body and generate a balance signal accordingly; the computing unit computes an angle changing value according to the balance signal from the balance sensor.

* * * * *